(12) United States Patent
Shohda et al.

(10) Patent No.: US 9,923,332 B2
(45) Date of Patent: Mar. 20, 2018

(54) ARRAY TYPE WAVELENGTH CONVERTING LASER DEVICE

(71) Applicant: Mitsubishi Electric Corporation, Tokyo (JP)

(72) Inventors: Fumio Shohda, Tokyo (JP); Takayuki Yanagisawa, Tokyo (JP); Kenichi Hirosawa, Tokyo (JP); Fumihiko Kannari, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/526,631

(22) PCT Filed: Jan. 8, 2016

(86) PCT No.: PCT/JP2016/050538
§ 371 (c)(1),
(2) Date: May 12, 2017

(87) PCT Pub. No.: WO2016/111361
PCT Pub. Date: Jul. 14, 2016

(65) Prior Publication Data
US 2017/0324209 A1    Nov. 9, 2017

(30) Foreign Application Priority Data

Jan. 9, 2015  (JP) .................. 2015-003243

(51) Int. Cl.
*H01S 3/13*   (2006.01)
*H01S 3/063*  (2006.01)
(Continued)

(52) U.S. Cl.
CPC .......... *H01S 3/1307* (2013.01); *H01S 3/0405* (2013.01); *H01S 3/0632* (2013.01);
(Continued)

(58) Field of Classification Search
CPC .......... H01S 3/1307; H01S 3/109; H01S 3/23; H01S 3/2383; H01S 3/2391;
(Continued)

(56) References Cited

U.S. PATENT DOCUMENTS 4,972,427 A  11/1990  Streifer et al.
4,985,897 A   1/1991  Botez et al.
(Continued)

FOREIGN PATENT DOCUMENTS

JP   H02-237089 A    9/1990
JP   H10-321953 A   12/1998
(Continued)

OTHER PUBLICATIONS

International Search Report issued in PCT/JP2016/050538; dated Mar. 8, 2016.
(Continued)

*Primary Examiner* — Armando Rodriguez
(74) *Attorney, Agent, or Firm* — Studebaker & Brackett PC (57) ABSTRACT

A device includes: at least one laser element with light emitting points to output fundamental waves in a one-dimensional array; a wavelength converting element to carry out wavelength conversion of the incident fundamental waves, and to output wavelength converted light rays; and an output mirror to reflect the fundamental waves, and to transmit the wavelength converted light rays resulting from the wavelength conversion by the wavelength converting element. The wavelength converting element is disposed between the laser element and the output mirror, and the distance between the position of a waist of the fundamental waves output from the laser element and the output mirror
(Continued)

is set in accordance with a Talbot condition under which the adjacent light emitting points cause phase synchronization with each other.

12 Claims, 9 Drawing Sheets

(51) Int. Cl.
  *H01S 3/094* (2006.01)
  *H01S 3/08* (2006.01)
  *H01S 3/0941* (2006.01)
  *H01S 3/04* (2006.01)
  *H01S 3/109* (2006.01)
  *H01S 3/23* (2006.01)

(52) U.S. Cl.
  CPC ........ *H01S 3/08072* (2013.01); *H01S 3/0941* (2013.01); *H01S 3/094049* (2013.01); *H01S 3/109* (2013.01); *H01S 3/23* (2013.01); *H01S 3/2383* (2013.01); *H01S 3/2391* (2013.01)

(58) Field of Classification Search
  CPC .. H01S 3/0632; H01S 3/0405; H01S 3/08072; H01S 3/094049; H01S 3/0941
  See application file for complete search history.

(56) References Cited

U.S. PATENT DOCUMENTS

| | | |
|---|---|---|
| 2008/0095202 A1 | 4/2008 | Yanagisawa et al. |
| 2010/0220384 A1 | 9/2010 | Kimura et al. |

FOREIGN PATENT DOCUMENTS

| | | |
|---|---|---|
| JP | 2008-124087 A | 5/2008 |
| JP | 4392024 B2 | 12/2009 |
| JP | 2010-204197 A | 9/2010 |
| WO | 2006/103767 A1 | 10/2006 |

OTHER PUBLICATIONS

Kenichi Hirosawa et al.; "Phase Locking in a Nd:YVO4 Waveguide Laser Array Using Talbot Cavity"; Optics Express 24952; Oct. 21, 2013; pp. 1-10; vol. 21, No. 21; Optical Society of America.

ARRAY TYPE WAVELENGTH CONVERTING LASER DEVICE

TECHNICAL FIELD

The present invention relates to an array type wavelength converting laser device for obtaining wavelength converted light rays.

BACKGROUND ART

Printers, projection televisions and the like require a light source with three colors R (Red), G (Green) and B (Blue) as their light sources. As the light source, a wavelength converting laser device has been developed which generates second harmonics (SHG: Second Harmonic Generation) of fundamental waves of 900 nm band, 1 μm band and 1.3 μm band laser light rays by using a nonlinear material. To achieve high conversion efficiency from the fundamental waves to the second harmonics, it is necessary to increase the power density of the fundamental waves on the nonlinear material and to obtain laser light rays with high light focusing power with a small wavefront aberration.

Figure 10:
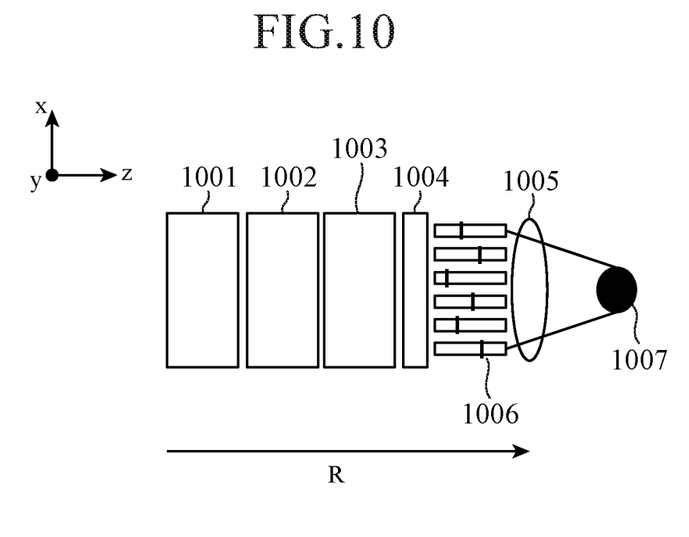
FIG. 10 is a top view schematically showing a configuration of a conventional array type wavelength converting laser device.

Thus, conventionally, an array type wavelength converting laser device as shown in FIG. 10 which can implement multiple oscillations in a spatial mode has been proposed (see Patent Document 1, for example). The array type wavelength converting laser device is comprised of a semiconductor laser 1001 with a plurality of light emitting points for outputting pumping light in a one-dimensional form; a planar waveguide type laser element 1002 with a heat sink (not shown) joined thereto for generating fundamental waves while being excited by the pumping light; a wavelength converting element 1003 for carrying out wavelength conversion of the fundamental waves to output second harmonics; and an output mirror 1004 for reflecting the fundamental waves and transmitting the second harmonics. In addition, in FIG. 10, a lens 1005 for focusing the light is placed after the output mirror 1004 of the laser device. Thus, temperature distribution is produced in the laser medium of the planar waveguide type laser element 1002 by the heat sink, thereby creating refractive index distribution in the laser medium. The laser medium creates a thermal lens effect with an effect equal to aligning a plurality of lenses in the array direction owing to the refractive index distribution in the laser medium. The thermal lens effect can bring about multiple oscillations in a spatial mode, thereby being able to produce the second harmonics with high efficiency.

CITATION LIST

Patent Literature

Patent Document 1: WO 2006/103767.

SUMMARY OF INVENTION

Technical Problem

However, since the array type wavelength converting laser device of the Patent Document 1 oscillates the laser light rays corresponding to the individual light emitting points independently, the phases of the laser light rays do not have correlation between the light emitting points (designated by the reference numeral 1006 of FIG. 10). Accordingly, for example, when the focusing lens 1005 is arranged outside a cavity to focus the light, the laser light rays emitted from the light emitting points are added without any correlation, which leads to an increase in the size of a beam after the focusing. In addition, there is a problem in that the light focusing power of the second harmonics is deteriorated for the same reason (reference numeral 1007 of FIG. 10).

The present invention is implemented to solve the foregoing problems. Therefore, it is an object of the present invention to provide an array type wavelength converting laser device capable of improving the light focusing power of the laser light as compared with a conventional setup.

Solution to Problem

An array type wavelength converting laser device in accordance with the present invention comprises: at least one laser element with light emitting points configured to output fundamental waves in a one-dimensional array; a wavelength converting element configured to carry out wavelength conversion of the incident fundamental waves, and to output wavelength converted light rays; and an output mirror configured to reflect the fundamental waves, and to transmit the wavelength converted light rays resulting from the wavelength conversion by the wavelength converting element, wherein the wavelength converting element is disposed between the laser element and the output mirror; and the distance between a position of a waist of the fundamental waves output from the laser element and the output mirror is set in accordance with a Talbot condition under which phase synchronization is achieved between the adjacent light emitting points with each other.

Advantageous Effects of Invention

According to the present invention, since it has the configuration as described above, it can improve the light focusing power of the laser light as compared with the conventional setup.

DESCRIPTION OF EMBODIMENTS

The best mode for carrying out the invention will now be described in detail with reference to the accompanying drawings. In the following, the same reference symbols designate the same or like components in the drawings. Incidentally, the present invention is not limited by the embodiments.

Embodiment 1

Figure 1:
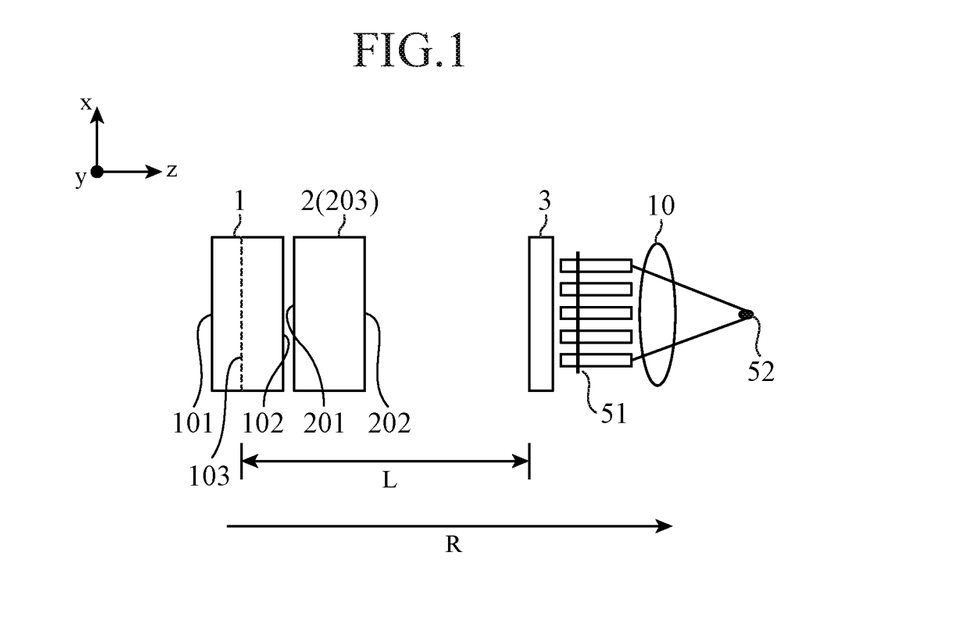
FIG. 1 is a top view schematically showing a configuration of an array type wavelength converting laser device of an embodiment 1 in accordance with the present invention.

FIG. 1 is a top view schematically showing a configuration of an array type wavelength converting laser device of an embodiment 1 in accordance with the present invention.

As shown in FIG. 1, the array type wavelength converting laser device comprises a laser element 1, a wavelength converting element 2, and an output mirror 3. In addition, a focusing lens 10 is disposed after the output mirror 3 of the array type wavelength converting laser device. Incidentally, an xyz coordinate system is determined as shown in FIG. 1. Then, it is assumed that z axis direction is the propagation direction of the laser light, namely, the direction of an optical axis R of a cavity (Talbot cavity) of the fundamental waves, which will be described later.

The laser element 1 is a component which has light emitting points (emitters) to output the fundamental waves in a one-dimensional array, and one or more of the laser elements are provided. In the example of FIG. 1, a single laser element 1 with a plurality of light emitting points is employed, and the light emitting points are aligned at regular intervals (including the meaning "at nearly equal intervals") d in x axis direction. For example, the laser element 1 is a semiconductor laser (LD) composed of a compound semiconductor for outputting laser light rays with desired wavelengths as the fundamental waves, and emits the fundamental waves from its end face 102.

In addition, a reflection film for reflecting the fundamental waves is applied onto the end face 101 of the laser element 1. In addition, an antireflection film for transmitting the fundamental waves is applied onto the end face 102 of the laser element 1. The reflection film and antireflection film are each formed by stacking dielectric thin films.

Furthermore, it may be such that when the laser element 1 generates heat, a cooling heat sink (not shown) is joined onto the bottom of the laser element 1 as needed so as to disperse the heat.

The wavelength converting element 2 is a component for carrying out wavelength conversion of the incident fundamental waves and outputting the wavelength converted light rays. The wavelength converting element 2 is comprised of a nonlinear material 203. In addition, the wavelength converting element 2 has end faces 201 and 202 perpendicular (including the meaning of "nearly perpendicular") to the direction of the optical axis R of the cavity, and the end face 201 is placed close to the end face 102 of the laser element 1 facing each other. In addition, in the wavelength converting element 2, the temperature or the period of a periodically poled structure is optimized so as to convert the incident fundamental waves to the wavelength converted light rays by a nonlinear effect.

In addition, the end face 201 of the wavelength converting element 2 has an optical film applied thereon to transmit the fundamental waves and to reflect the wavelength converted light rays. In addition, the end face 202 of the wavelength converting element 2 has an optical film applied thereon to transmit the fundamental waves and the wavelength converted light rays. The optical films are formed, for example, by stacking dielectric thin films.

Incidentally, as the nonlinear material 203 of the wavelength converting element 2, it is possible to use an ordinary material for the wavelength conversion. For example, KTP, KN, BBO, LBO, CLBO, $LiNbO_3$, $LiTaO_3$ or the like can be used. In addition, using an MgO doped $LiNbO_3$, MgO doped $LiTaO_3$, stoichiometric $LiNbO_3$, stoichiometric $LiTaO_3$, which are resistant to optical damages, makes it possible to increase the power density of the incident fundamental waves, which enables highly efficient wavelength conversion. In addition, using an MgO doped $LiNbO_3$, MgO doped $LiTaO_3$, stoichiometric $LiNbO_3$, stoichiometric $LiTaO_3$, KTP, which have a periodically poled structure, makes it possible to achieve higher efficient wavelength conversion because of a larger nonlinear constant.

Furthermore, it may be such that when the wavelength converting element 2 generates heat, a cooling heat sink (not shown) is joined onto the bottom of the wavelength converting element 2 as needed, so as to disperse the heat.

The output mirror 3 is a component for reflecting the fundamental waves, and for transmitting the wavelength converted light rays resulting from the wavelength conversion by the wavelength converting element 2. The output mirror 3 is provided for setting up a cavity (Talbot cavity) of the fundamental waves between the laser element 1 and the output mirror 3, and is placed face to face with the end face 202 of the wavelength converting element 2. In addition, the output mirror 3 has an optical film applied thereto for reflecting the fundamental waves and for transmitting the wavelength converted light rays. The optical film is formed by stacking dielectric thin films, for example.

In addition, the output mirror 3 is disposed in such a manner that the distance L satisfies a fixed condition, where L is the distance between the waist 103 of the laser light (fundamental waves) output by the arrayed laser element 1 and the output mirror 3. At this time, phase synchronization occurs when the plurality of adjacent light emitting points located periodically satisfy with each other the fixed condition (Talbot condition) as to the distance L. The phenomenon is referred to as Talbot phase lock. Incidentally, the term "waist 103" refers to a position where the wavefronts of the individual laser light rays of the array become a plane wave. It is the end face 101 when the laser element 1 does not have the lens effect, but is located at a certain place inside the cavity when the lens effect occurs or when an optical component is disposed Here, the distance L at which the Talbot phase lock is achieved will be described.

For example, when the optical length of the distance L is a quarter of the Talbot length, the Talbot phase lock is achieved. The optical length is a value obtained by dividing the distance L by the refractive index of the propagation region of the laser light. In addition, the Talbot length is given by $2d^2/\lambda$ where d is an interval between the light emitting points of the laser element 1, and $\lambda$ is the wavelength of the laser light rays.

Here, a Non-patent Document 1 describes the results of a theoretical examination about a range of the distance L at which the Talbot cavity can be obtained in a device with 15 light emitting points. Then the Non-patent Document 1 describes that the Talbot phase lock is achieved even when the optical length is varied by ±6 mm with respect to the optical length of 19 mm equal to a quarter of the Talbot length. In other words, the Talbot phase lock can be achieved even when the optical length of the distance L is set with a tolerance of ±30% with respect to an optical length equal to a quarter of the Talbot length.

Non-patent Document 1: Kenichi Hirosawa, Seiichi Kittaka, Yu Oishi, Fumihiko Kannari, and Takayuki Yanagisawa, "Phase lock in a Nd:YVO4 waveguide laser array using Talbot cavity," Opt. Express 21, 24952-24961 (2013)

When the optical length of the distance L is set to a quarter of the Talbot length or within its tolerance, the distance L becomes shortest for implementing the Talbot phase lock, thereby being able to realize the downsizing of the array type wavelength converting laser device.

However, the condition for the Talbot phase lock is not limited to the case where the optical length of the distance L is set to the quarter of the Talbot length or within its tolerance. The Talbot phase lock is achieved even when the optical length of the distance L is set to the quarter of the Talbot length+n/2, where n is a positive integer, or within its tolerance.

Next, the operation of the array type wavelength converting laser device of an embodiment 1 will be described. Incidentally, the following description will be made using an example in which an element for converting the fundamental waves to the second harmonics is employed as the wavelength converting element 2.

First, the laser element 1 outputs the fundamental waves from the individual light emitting points one-dimensionally arrayed. FIG. 2 is a diagram illustrating a near field pattern and a far field pattern of the electric field phase component and the electric field strength component of the laser light rays in the Talbot cavity. As shown in FIG. 2, the distance L is set in such a manner as to achieve the Talbot phase lock and to cause interference patterns of the laser light to appear.

Figure 2A:
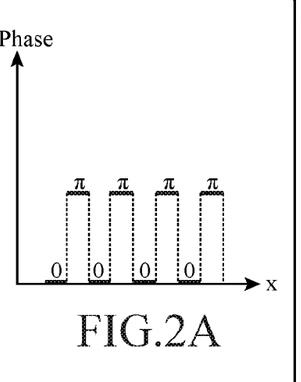
FIGS. 2A-2E are diagrams showing a near field pattern and a far field pattern of electric field phase components and electric field strength components of laser light in a Talbot cavity of the embodiment 1 in accordance with the present invention.
Figure 2B:
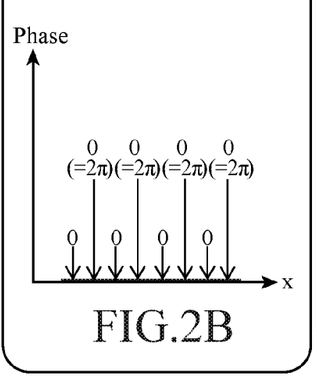
Figure 2C:
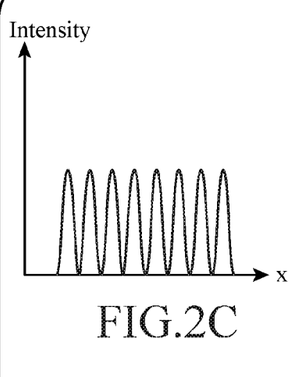
Figure 2D:
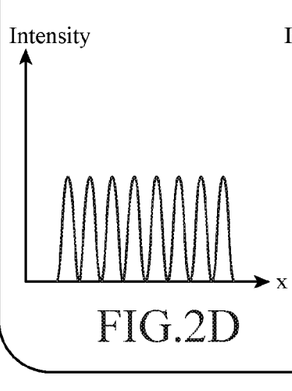

Here, when there are M light emitting points, the phases of the individual light emitting points coincide in the lowest degree mode (primary mode), thereby resulting in an in-phase mode. On the other hand, in the highest degree mode (Mth degree mode), the phases of the individual light emitting points reverse alternately, thereby resulting in a state called an alternate phase mode. For example, according to the Non-patent Document 1, when the optical length of the cavity is set to a quarter of the Talbot length, the loss of the highest degree mode is lowest as compared with all the other degree modes. Thus, it is possible to establish only the highest degree mode, that is, only the alternate phase mode efficiently. Accordingly, as shown in FIG. 2A and FIG. 2C, the fundamental waves selectively oscillate in the alternate phase mode only by setting the optical length of the distance L to a quarter of the Talbot length.

Next, the wavelength converting element 2 carries out the wavelength conversion of the incident fundamental waves and outputs the second harmonics. Incidentally, as for the wavelength converting element 2 disposed inside the cavity, the temperature or the period of the periodically reversed polarization is optimized in such a manner that the incident fundamental waves are converted to the second harmonics by the nonlinear effect. Accordingly, when the fundamental waves oscillated between the end face 101 of the laser element 1 and the output mirror 3 strike on the wavelength converting element 2, parts of the fundamental waves are converted to the second harmonics. After that, the second harmonics are transmitted through the output mirror 3 to be output to the outside.

On the other hand, as for the residual fundamental waves that are not converted to the second harmonics by the wavelength converting element 2, they are reflected by the output mirror 3 and strike on the wavelength converting element 2, again, and undergo the wavelength conversion to the second harmonics. After that, the second harmonics resulting from the conversion of parts of the residual fundamental waves are reflected on the end face 201 of the wavelength converting element 2, transmitted through the output mirror 3, and output to the outside.

Figure 2E:
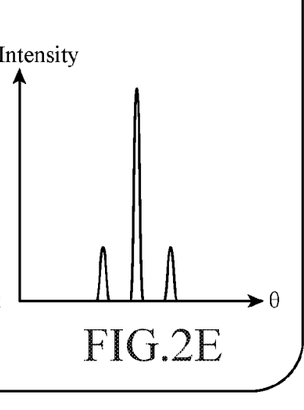

Here, as for the second harmonics, their phases are twice those of the fundamental waves. Thus, the second harmonics from the adjacent individual light emitting points are all in-phase mode as shown in FIG. 2B (as indicated by the reference numeral 51 of FIG. 1). In addition, when it is assumed that the spread angle of the second harmonics is θ, the electric field strength of a far field pattern has a high peak at the center as shown in FIG. 2E, thus causing a single beam.

After that, as shown in FIG. 1, the focusing lens 10 disposed at the outside of the output mirror 3 reduces the beam diameter of the wavelength converted light rays output from the output mirror 3. This makes it possible to extract a single beam spot with a small focusing size in the array direction (x axis direction) (the reference numeral 52 of FIG. 1).

Incidentally, the foregoing description is made using an example in which the element for obtaining the second harmonics by carrying out wavelength conversion of the fundamental waves is employed as the wavelength converting element 2. However, this is not essential. For example, setting up a Talbot cavity for generating an mth harmonic, where m is an integer, can also coincide the phases of the laser light rays corresponding to the individual light emitting points, thereby being able to improve the light focusing power in the array direction. In particular, when m is an even number, not only the in-phase components, but also the alternate phase components of all the fundamental waves become in-phase at the mth harmonic. Accordingly, it can achieve higher luminance and offers an advantage of being able to realize a single peak in the far field pattern.

In addition, the present invention, which utilizes only the phase synchronization technique with the Talbot cavity, can improve the light focusing power of the laser light by controlling the phase of the harmonics without using an additional phase shifter or the like.

In addition, the embodiment 1 shows the configuration in which a semiconductor laser is employed as the laser element 1. Since highly accurate light emitting points can be formed with the semiconductor laser through an epi process, the semiconductor laser has a characteristic in that the pitch for providing the Talbot condition is stabilized. In addition, since the emission intensity can be adjusted by the semiconductor laser through the epi process or current density, an adjustment can be made in such a manner as to achieve a desired far field pattern.

Furthermore, the foregoing shows a configuration in which a single semiconductor laser with a plurality of light emitting points is employed as the laser element 1. However, this is not essential. For example, aligning a plurality of semiconductor lasers with a single light emitting point can achieve a similar effect.

As described above, according to the present embodiment 1, it is configured in such a manner that the distance L between the position of the waist 103 of the fundamental waves outputted by the laser element 1 and the output mirror 3 is set in accordance with the Talbot condition under which the phase synchronization between the adjacent light emitting points with each other is established. As a result, it can improve the light focusing power of the laser light as compared with the conventional setup.

In addition, since it can reduce the effective spread angle in the array direction by the phase control of the individual light emitting points, it can carry out the highly efficient wavelength conversion. Furthermore, since the fundamental waves have alternate phases, it can oscillate the stable mth harmonic.

Embodiment 2

The embodiment 1 shows the structure in which the semiconductor laser is used as the laser element 1, for example. In contrast with this, the embodiment 2 shows a setup in which the laser element 1 is comprised of a solid-state laser array composed of a solid-state laser element 5 and a semiconductor laser 4 for exciting the laser element 5.

Figure 3:
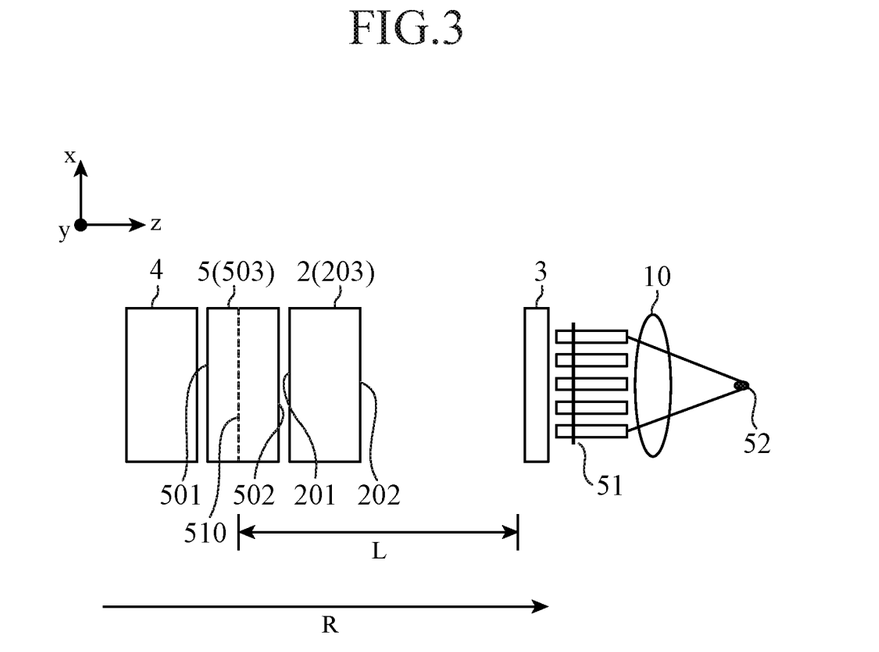
FIG. 3 is a top view schematically showing a configuration of an array type wavelength converting laser device of an embodiment 2 in accordance with the present invention.

FIG. 3 is a top view schematically showing a configuration of an array type wavelength converting laser device of the embodiment 2 in accordance with the present invention. The array type wavelength converting laser device of the embodiment 2 shown in FIG. 3 replaces the laser element 1 of the array type wavelength converting laser device of the embodiment 1 shown in FIG. 1 by the semiconductor laser 4 and solid-state laser element 5. Since the other components are the same, they are designated by the same reference numerals and only the different portion will be described.

The semiconductor laser 4 is a component which has light emitting points (emitters) and outputs the pumping light arrayed one-dimensionally. The pumping light is the laser light of which the wavelength is set so as to excite the solid-state laser element 5. In the example of FIG. 3, the semiconductor laser 4 with a plurality of light emitting points is used, and the light emitting points are aligned at regular intervals (including the meaning "at nearly equal intervals") in the x axis direction. The emitting side face of the pumping light of the semiconductor laser 4 is placed face to face and close to an end face 501 of the solid-state laser element 5. The semiconductor laser 4 is composed of a compound semiconductor for outputting the laser light with the wavelength for exciting the solid-state laser element 5.

Furthermore, it may be such that when the semiconductor laser 4 generates heat, a cooling heat sink (not shown) is joined onto the bottom of the semiconductor laser 4 as needed so as to disperse the heat.

The solid-state laser element 5 is a component for producing population inversion by the pumping light from the semiconductor laser 4 to generate the laser light (spontaneous emission light), amplifying the laser light by stimulated emission, and outputting it. The solid-state laser element 5 is comprised of a laser medium 503. In addition, the solid-state laser element 5 has end faces 501 and 502 perpendicular (including the meaning of "nearly perpendicular") to the direction of the optical axis R of the cavity, and has a rectangular shape, a circular shape, or the like.

In addition, the end face 501 of the solid-state laser element 5 has a reflection film applied thereon to reflect the fundamental waves. Besides, the end face 502 of the solid-state laser element 5 has an antireflection film applied thereon for transmitting the fundamental waves. The reflection film of the end face 501 is an optical film for transmitting the pumping light and reflecting the fundamental waves. The reflection film (optical film) and antireflection film are formed by stacking the dielectric thin films, for example.

In addition, as the laser medium 503 of the solid-state laser element 5, it is possible to use an ordinary laser medium. For example, Nd:YAG, Nd:YLF, Nd:Glass, Nd:YVO$_4$, Nd:GdVO$_4$, Yb:YAG, Yb:YLF, Yb:KGW, Er:Glass, Er:YAG, Tm:YAG, Tm:YLF, Ho:YAG, Ho:YLF, Ti:Sapphire, Cr:LiSAF or the like can be used.

Incidentally, in the embodiment 2, a cavity of the fundamental waves is formed between the end face 501 of the solid-state laser element 5 and the output mirror 3. Then the distance L between the position of the waist 510 of the laser light (fundamental waves) output by the solid-state laser element 5 and the output mirror 3 is set according to the Talbot condition under which the phase synchronization occurs between the adjacent light emitting points with each other.

Next, the operation of the array type wavelength converting laser device of the embodiment 2 will be described.

First, the semiconductor laser 4 outputs the one-dimensionally arrayed pumping light from the individual light emitting points. Then, the pumping light strikes the end face 501 of the solid-state laser element 5 and excites the solid-state laser element 5. At this time, in the laser medium 503, the pumping light generates the population inversion, which starts a mode in which the laser light (spontaneous emission light) emitted in the direction of the optical axis R resonates, and the laser light is amplified by the stimulated emission. After that, the laser light makes a round trip between the end face 501 of the solid-state laser element 5 and the output mirror 3 (cavity), but when amplification gain through one round of the cavity matches loss involved through the one round of the cavity, the fundamental waves oscillates.

The operation after the oscillation of the fundamental waves is the same as that of the embodiment 1. Thus, the wavelength converting element 2 converts the fundamental waves to the wavelength converted light rays and outputs the wavelength converted light rays from the output mirror 3 to the outside.

Here, since the cavity of the fundamental waves, which is set up between the end face 501 of the solid-state laser element 5 and the output mirror 3, is configured in such a manner as to carry out the Talbot phase lock, the laser device can obtain the laser light with high light focusing power as in the embodiment 1.

In addition, although the foregoing shows the case in which the single semiconductor laser 4 with a plurality of light emitting points is used, this is not essential. For example, aligning a plurality of semiconductor lasers 4 each having a single light emitting point can achieve a similar effect.

Furthermore, although the foregoing shows the case in which the single semiconductor laser 4 with a plurality of light emitting points and the single solid-state laser element 5 are included, this is not essential. For example, an arrangement is also possible in which a plurality of semiconductor lasers 4 each having a single light emitting point and a plurality of solid-state laser elements 5 are disposed in such a manner that the emitting points are aligned, offering the same advantages.

As described above, according to the present embodiment 2, since it employs as the laser element 1 the solid-state laser array which is comprised of the semiconductor laser 4 and the solid-state laser element 5, it can obtain a stable cavity which has a small wavefront aberration caused by the gain and intensity of the laser light and which is proof against disturbance in addition to the advantages of the embodiment 1.

Embodiment 3

In the setups of the embodiments 1 and 2, oscillation is performed in the spatial mode, so that it is necessary for them to adjust the mode with the cavity not only in the direction of the optical axis R of the cavity, but also in the height direction (y axis direction) perpendicular to the array direction. In contrast with this, the embodiment 3 shows an example that comprises a planar waveguide structure in the height direction of the laser element 1 (solid-state laser element 5) and wavelength converting element 2 to enable control in the guided mode in the height direction, thereby achieving a high beam quality.

Figure 4A:
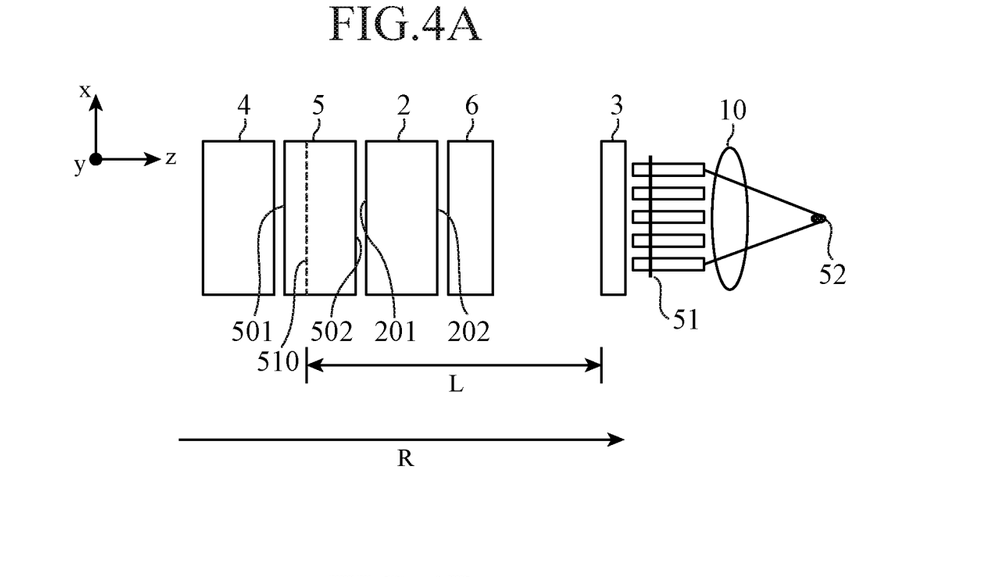
FIGS. 4A and 4B are a top view and a side view schematically showing a configuration of an array type wavelength converting laser device of an embodiment 3 in accordance with the present invention.
Figure 4B:
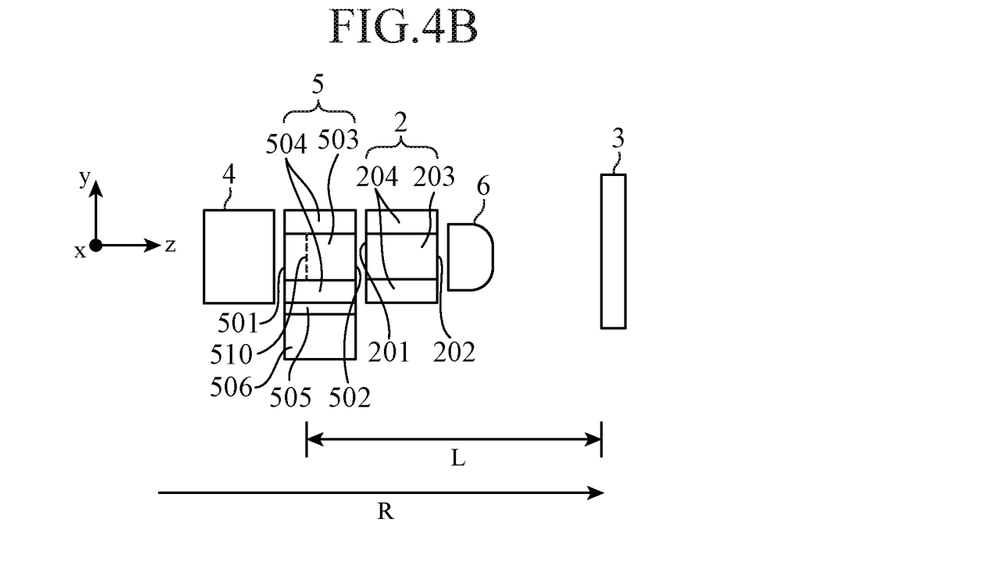

FIG. 4 is a top view and a side view schematically showing a configuration of an array type wavelength converting laser device of the embodiment 3 in accordance with the present invention. Incidentally, FIG. 4B omits the illustration of the laser light rays output from the output mirror 3 and the lens 10. The array type wavelength converting laser device of the embodiment 3 shown in FIG. 4 is set up by adding a lens 6 to the array type wavelength converting laser device of the embodiment 2 shown in FIG. 3, and by providing a planar waveguide structure in the height direction of the solid-state laser element 5 and wavelength converting element 2. Since the other components are the same, they are designated by the same reference numerals and only the different portion will be described.

As shown in FIG. 4B, the solid-state laser element 5 of the embodiment 3 has claddings 504 provided on the top and bottom surfaces of a tabular laser medium 503. Incidentally, the laser medium 503 is formed in a plane (xy plane) perpendicular to the optical axis R of the cavity and formed in a rectangle of which the side in the array direction (x axis direction) is longer than the side in the height direction (y axis direction).

As the claddings 504, any medium with a refractive index less than the refractive index of the laser medium 503 is applicable, since they can confine the laser light inside the laser medium 503. The claddings 504 can be formed, for example, by depositing a film made from an optical material, or by optically joining an optical material to the laser medium 503 by means of optical contact or diffused junction. Alternatively, an optical adhesive with a refractive index less than that of the laser medium 503 can be employed.

Thus, in the height direction of the laser medium 503, it is sandwiched between the claddings 504 with the refractive index less than that of the laser medium 503. Accordingly, the solid-state laser element 5 operates as a waveguide that confines the fundamental waves inside the laser medium 503 with a higher refractive index, thereby causing the fundamental waves to be selectively oscillated in the guided mode.

Figure 5:
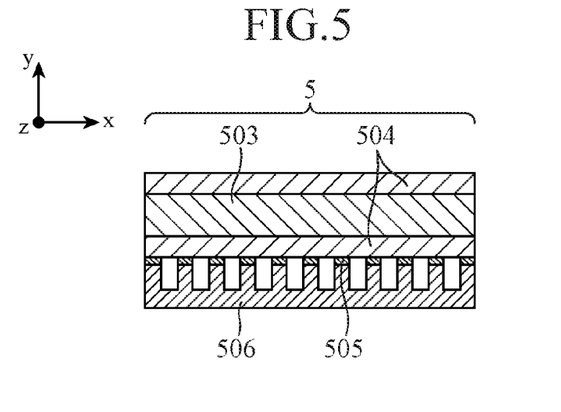
FIG. 5 is a front cross-sectional view showing a configuration of the solid-state laser element of the embodiment 3 in accordance with the present invention.

In addition, to the bottom of the cladding 504 joined to the bottom of the laser medium 503, a heat sink 506 is joined via a glue 505. The heat sink 506 is composed of a material with a large thermal conductivity, and is formed in a comblike fashion in the array direction in a plane (xy plane) perpendicular to the optical axis R as shown in FIG. 5. Then the top of the individual comb teeth of the heat sink 506 is joined to the cladding 504 via the glue 505. The pumping light from the semiconductor laser 4 incident on the laser medium 503 enters between the adjacent comb teeth of the heat sink 506.

The glue 505 disperses heat generated by the laser medium 503 to the heat sink 506 via the cladding 504. As the glue 505, it is possible to use metal solder, optical adhesive, thermally conductive adhesive or the like.

In addition, to increase the bond strength with the glue 505, the face of the cladding 504 facing the glue 505 can be metalized with a metal film. In addition, when forming the heat sink 506 from an optical material, the cladding 504 and the heat sink 506 can be joined directly by means of the optical contact or diffused junction.

As for the wavelength converting element 2 of the embodiment 3, claddings 204 with a refractive index less than that of the nonlinear material 203 are formed on the top and bottom surfaces of the nonlinear material 203 as shown in FIG. 4B. This enables the wavelength converting element 2 to operate as a waveguide in the height direction just as the solid-state laser element 5.

The lens 6 is a cylindrical lens disposed between the wavelength converting element 2 and the output mirror 3 to control the beam diameter in the height direction so as to collimate it. For example, an FAC (Fast Axis Collimate) lens or the like is used.

The laser oscillation in the height direction inside the cavity is controlled by the lens 6 inside the cavity. More specifically, the lens 6 can suppress the beam spread in the height direction and stabilize the oscillation, and reduce the dissipation of the laser light inside the cavity.

With the foregoing setup, the solid-state laser element and the wavelength converting element 2 can control the laser oscillation in the height direction in the guided mode. On the other hand, as for the direction of the optical axis R, the distance between the position of the waist 510 of the laser light (fundamental waves) output from the solid-state laser element 5 and the output mirror 3 is adjusted to the length which achieves the Talbot phase lock as described in the embodiment 1. Thus, enabling the independent adjustment in the height direction and in the optical axis R direction can improve the efficiency of the phase composition of the laser light rays, thereby being able to realize the laser light with high light focusing power.

As for the laser oscillation in the height direction inside the cavity, it oscillates selectively in the guided mode of the laser medium 503 or nonlinear material 203. The guided mode of the laser medium 503 and the guided mode of the nonlinear material 203 can each be set freely in accordance with the thickness in the height direction of the laser medium 503 and that of the nonlinear material 203, and the refractive index difference between the claddings 504 and 204.

Incidentally, as for the guided mode of the laser medium 503 and the guided mode of the nonlinear material 203, it is not always necessary that they coincide with each other. For example, one of the aforementioned guided modes is set as a multi-mode while the other of the aforementioned guided modes is set as a single mode. Since the mode of the laser oscillation is limited by the mode with the lowest degree, selective oscillation in the single mode is possible. It goes without saying that they can be set up to operate in the same guided mode.

In addition, in the configuration of the embodiment 3, the thickness of the laser medium 503 in the height direction becomes thinner, and the power density of the fundamental waves incident on the nonlinear material 203 becomes higher. As a result, it can output the wavelength converted light rays at higher efficiency.

In addition, in the configuration of the embodiment 3, the thickness of the laser medium 503 in the height direction becomes thinner, and the power density of the pumping light becomes higher, so that it can obtain high gain even if it employs a small gain laser medium or a three-level laser medium with a large lower level absorption. As a result, it can output the fundamental waves at higher efficiency, and thus can output the wavelength converted light rays at higher efficiency.

In addition, since the thickness of the laser medium 503 in the height direction is thinner, the temperature rise of the laser medium 503 is lower. Accordingly, it can output the fundamental waves at higher efficiency even if it employs a three-level laser medium whose gain is reduced by the temperature rise, thereby being able to output the wavelength converted light rays at higher efficiency.

Figure 6:
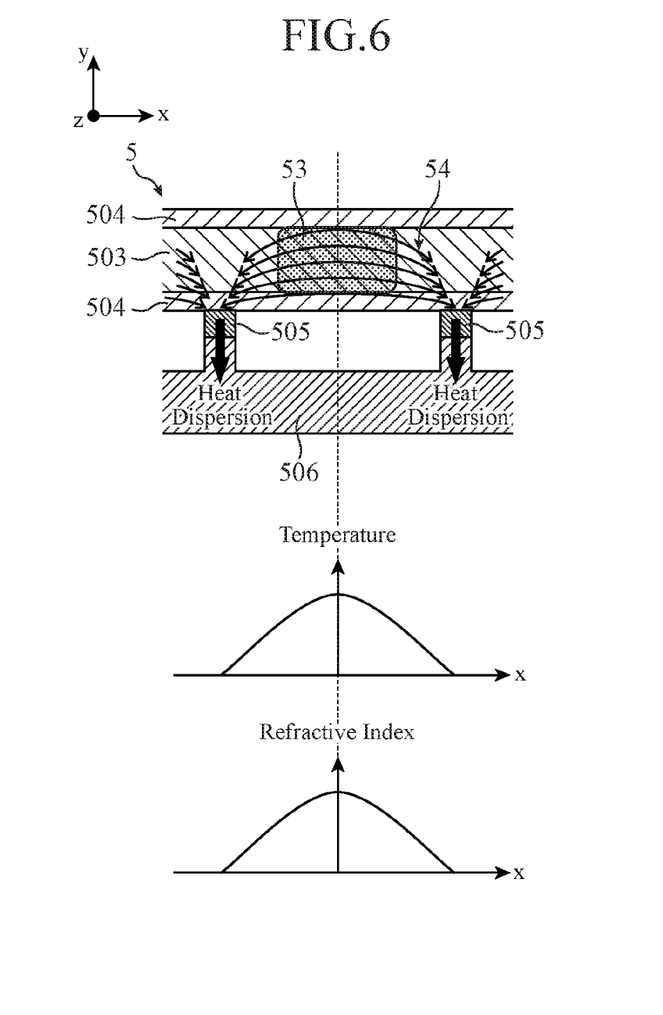
FIG. 6 is an enlarged cross-sectional view of FIG. 5, and a diagram showing a temperature distribution and a refractive index distribution.

Next, the temperature distribution generated in the laser medium 503 will be described with reference to FIG. 6. In FIG. 6, the reference numeral 53 designates an excitation region, and the reference numeral 54 designates a heat flow.

In the laser medium 503, part of the power of the pumping light is converted to heat, thereby generating heat. Then, as shown in FIG. 6, the heat generated in the laser medium 503 is dispersed to the heat sink 506 via the cladding 504 and glue 505.

Here, the heat sink 506 has a comblike structure, and the part bonded to the cladding 504 by the glue 505 is only the tips of the comb teeth. Accordingly, between the adjacent comb teeth, a heat flow occurs from about the center between the comb teeth to both directions along the array direction (x axis direction). Accordingly, the temperate at about the center between the comb teeth becomes maximum, and the temperature falls as its position approaches the comb teeth.

On the other hand, as for the optical material of the laser medium 503 or the like, its refractive index varies approximately in proportion to the temperature difference. When a material with a positive refractive index variation per unit temperature dn/dT is used as the optical material of the laser medium 503, the refractive index increases about the center between the comb teeth, where the temperature is high, and the refractive index decreases as its position approaches the comb teeth. As a result, the thermal lens effect occurs in the array direction with its optical axis being located about the center between the comb teeth.

Here, the pumping light incident on the laser medium 503 from the semiconductor laser 4 is nearly uniformly excited in the array direction, and the comb teeth of the heat sink 506 are disposed at nearly regular intervals in the array direction. Accordingly, the thermal lens effect occurs periodically, and thus an effect similar to the case where (m−1) lenses are aligned at nearly regular intervals is obtained, where m is the number of the comb teeth.

Incidentally, the intensity and period of the thermal lens effect taking place periodically are freely adjustable in accordance with the spacing between the comb teeth of the heat sink 506, the thickness of the comb teeth, the length and thermal conductivity of the comb teeth, the thermal conductivity and thickness of the glue 505, and the material and thickness of the claddings 504.

Likewise, when a material with a negative refractive index variation per unit temperature do/dT is used as the optical material of the laser medium 503, its refractive index distribution is opposite to the foregoing temperature distribution. That is, the refractive index is large at the comb teeth, and is small near the center of the comb teeth. As a result, the thermal lens effect occurs in the array direction with its optical axis being located at the comb teeth portion. In this case, the effect similar to the case where m lenses are aligned at nearly regular intervals is obtained, where m is the number of the comb teeth.

Incidentally, although the space between the comb teeth of the heat sink 506 is usually air, the space can be filled with a heat insulating material with a thermal conductivity less than that of the heat sink 506. In this case, in the laser medium 503, periodic temperature distribution occurs which is caused by a difference in the thermal conductivity between the tips of the comb teeth and the heat insulating material.

Thus, using the heat insulating material enables finer adjustment of the intensity and distribution of the thermal lens effect. In addition, filling the spacing between the comb teeth with the heat insulating material can increase the rigidity of the heat sink 506 as well.

As described above, according to the present embodiment 3, since it comprises the planar waveguide structure in the height direction of the laser element 1 (solid-state laser element 5) and wavelength converting element 2, it can carry out the control in the guided mode in the height direction in addition to the effect of the embodiment 2. Accordingly, it can obtain the laser light with higher light focusing power in both the optical axis R direction and height direction.

In addition, since it comprises the lens 6 for collimating the laser light in the height direction between the wavelength converting element 2 and the output mirror 3, it can adjust the space propagation region with the lens 6. As a result, it can adjust the cavity length L in the direction of the optical axis R so as to satisfy the Talbot condition, and can adjust the mode in the height direction by the focusing distance and position of the lens 6, thereby being able to make mode adjustment independently in both the axes.

In addition, using the comblike heat sink 506 in the solid-state laser element 5 causes the temperature distribution to occur in the laser medium 503, thereby generating the refractive index distribution. This brings about the same lens effect as in the case where the plurality of lenses are aligned in the array direction. According to the lens effect, it has multiple oscillations occurring in the spatial mode, and improves the beam quality of the individual laser light rays in the array direction, thereby being able to stabilize the cavity and to increase its efficiency. In addition, a combination of the laser light rays makes it possible to obtain the laser light with higher beam quality.

Incidentally, although employing the comblike heat sink 506 contributes to stabilizing the cavity and to obtaining the high beam quality laser light, this is not essential in the present embodiment 3. For example, the heat sink and the laser element 1 can be wholly joined face to face, or the heat sink can be removed if the heat dispersion is not required. In this case also, it can obtain the laser light with high light focusing power in the array direction by the Talbot phase lock. Since it employs the planar waveguide structure as to the laser element 1 (solid-state laser element 5) and the wavelength converting element 2 in the height direction, it can obtain the laser light with high light focusing power.

Embodiment 4

To obtain the cavity length L in the configuration of the embodiment 3 shown in FIG. 4, there exists a space propagation region without any waveguide structure inside the cavity. However, in the space propagation region, the laser light does not undergo the control in the guided mode in the height direction (y axis direction), so that its diffraction loss is great. In addition, it is necessary to control the cavity length L to stabilize the laser light in the height direction, but the cavity length L is limited by the Talbot condition along the direction of the optical axis R, so that there is a problem of being unable to alter the cavity length L freely. Thus, the embodiment 4 shows a method of eliminating the space propagation region to reduce the loss in the height direction and to output the wavelength converted light rays efficiently.

Figure 7A:
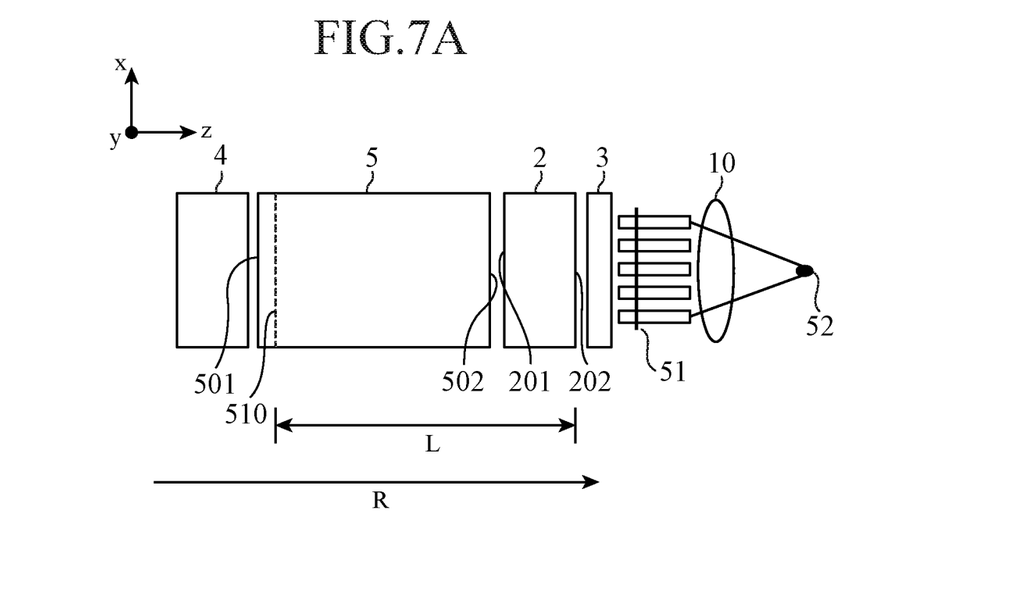
FIG. 7A and FIG. 7B are a top view and a side view schematically showing a configuration of an array type wavelength converting laser device of an embodiment 4 in accordance with the present invention.
Figure 7B:
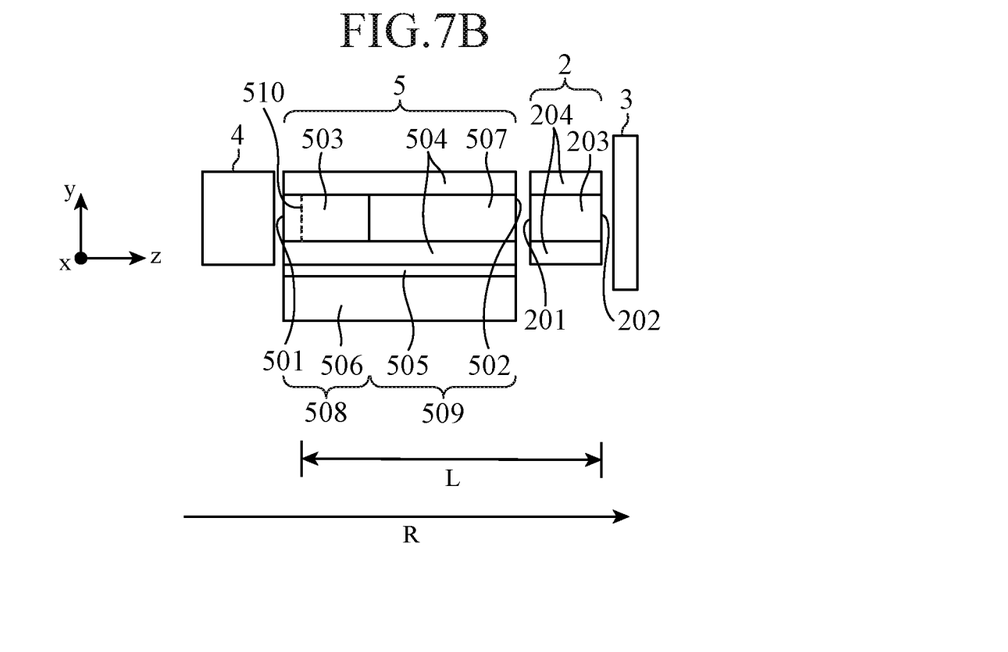

FIG. 7 is a top view and a side view schematically showing a configuration of an array type wavelength converting laser device of the embodiment 4 in accordance with the present invention. Incidentally, FIG. 7B omits the illustration of the laser light output from the output mirror 3 and the lens 10. The array type wavelength converting laser device of the embodiment 4 shown in FIG. 7 comprises a propagation unit 509 with a planar waveguide structure added to the solid-state laser element 5 of the array type wavelength converting laser device of the embodiment 3 shown in FIG. 4. Incidentally, the setup of the solid-state laser element 5 in the embodiment 3 is referred to as a gain generating unit 508. Since the other components are the same, they are designated by the same reference numerals and only the different portion will be described.

The solid-state laser element 5 comprises the gain generating unit 508 including the laser medium 503, and a propagation unit 509 including a propagation medium 507 without a gain. The propagation unit 509 is a component for obtaining the distance L to obtain the Talbot phase lock. In addition, the laser medium 503 and propagation medium 507 are combined with the claddings 504, glue 505, and heat sink 506 to form an integrated planar waveguide structure.

Incidentally, to set up a waveguide between the propagation medium 507 and the claddings 504 on its top and bottom, a medium with a refractive index greater than that of the claddings 504 is selected as the propagation medium 507. Thus, in the propagation unit 509, the laser light propagates in the guided mode nearly equal to that in the gain generating unit 508.

Forming the propagation unit 509 with the planar waveguide structure in this way makes it possible to remove the space propagation region from the configuration of the embodiment 3 shown in FIG. 4. Accordingly, the laser light inside the cavity is confined in the height direction. As a result, it can reduce the loss accompanying the spatial propagation as compared with the configuration of the embodiment 3, oscillate the laser light at higher efficiency, and output the wavelength converted light rays at higher efficiency.

In addition, when employing an Nd-based 4-level material as the laser medium 503, the laser light does not incur a loss during the propagation through the laser medium 503, so that the propagation medium 507 can use the same material as the laser medium 503. In this case, the gain generating unit 508 and the propagation unit 509 can be formed from the same material. This makes it possible to simplify the configuration as compared with the case where the foregoing laser medium 503 and the propagation medium 507 differ.

In addition, removing the space propagation region enables reducing the beam spread in the height direction and the dissipation of the laser light inside the cavity, which occurs in the configuration of the embodiment 3. Accordingly, it can remove from the configuration of the embodiment 3 the lens 6 inserted for collimating in the height direction. As a result, a highly reliable array type wavelength converting laser device which can reduce the adjustment of the optical components can be set up.

In addition, in the configuration of FIG. 7, as for the optical film on the end face 202 of the wavelength converting element 2, it can be changed from the optical film that transmits the fundamental waves to an optical film that reflects the fundamental waves, and the output mirror 3 can be removed. In this case, since the removal of the output mirror 3 can reduce the number of the components, it can reduce the cost of manufacture. In addition, the reduction in the number of the optical components can reduce the adjustment, thereby being able to set up a highly reliable array type wavelength converting laser device.

As described above, according to the present embodiment 4, since the solid-state laser element 5 comprises the propagation unit 509, it can remove the space propagation region inside the cavity, reduce the diffraction loss due to the space propagation, and output the wavelength converted light rays at higher efficiency in addition to the advantages of the embodiment 3.

Embodiment 5

The embodiment 4 shows the configuration in which the solid-state laser element 5 includes the propagation unit 509. In contrast with this, the embodiment 5 shows a configuration in which a propagation unit 207 is provided in the wavelength converting element 2 so as to remove the space propagation region, and to output the wavelength converted light with a small loss in the height direction efficiently.

Figure 8A:
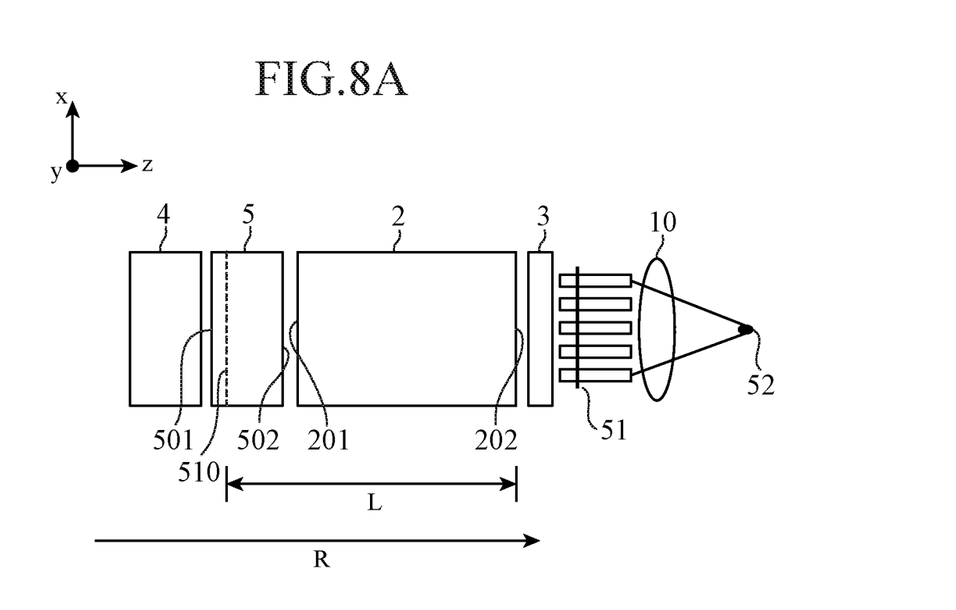
FIG. 8A and FIG. 8B are a top view and a side view schematically showing a configuration of an array type wavelength converting laser device of an embodiment 5 in accordance with the present invention.
Figure 8B:
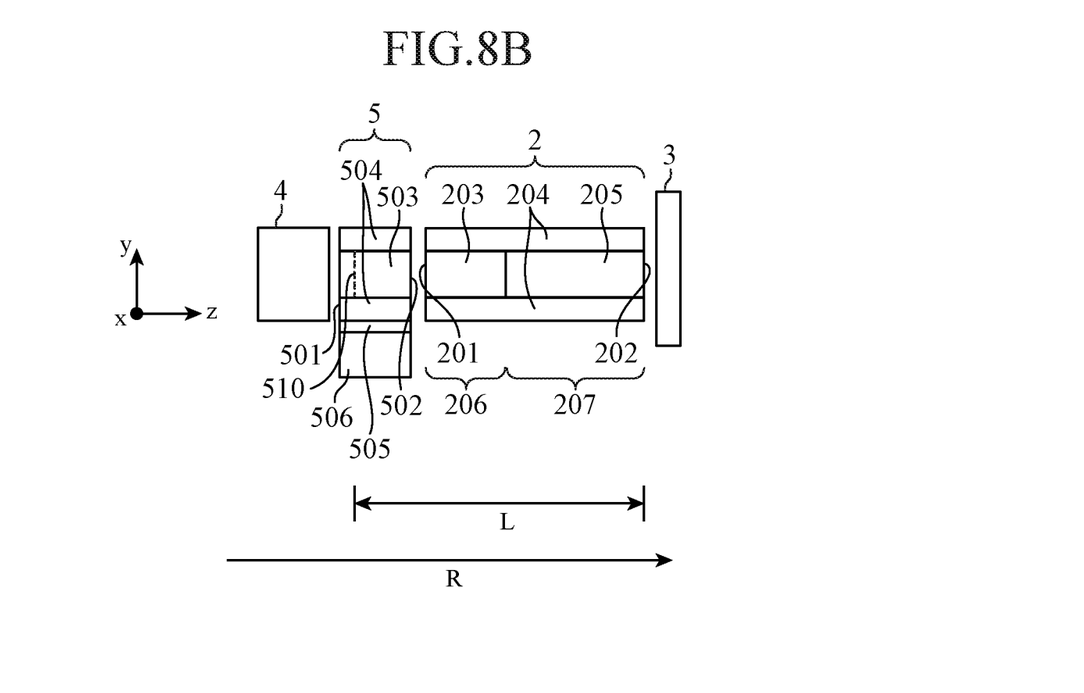

FIG. 8 is a top view and a side view schematically showing a configuration of an array type wavelength converting laser device of the embodiment 5 in accordance with the present invention. Incidentally, FIG. 8B omits the illustration of the laser light output from the output mirror 3 and the lens 10. The array type wavelength converting laser device of the embodiment 5 shown in FIG. 8 is set up by adding the propagation unit 207 to the wavelength converting element 2 of the array type wavelength converting laser device of the embodiment 3 shown in FIG. 4. Incidentally, the setup of the wavelength converting element 2 in the embodiment 3 is referred to as a wavelength converting unit 206. Since the other components are the same, they are designated by the same reference numerals and only the different portion will be described.

The wavelength converting element 2 comprises the wavelength converting unit 206 composed of the nonlinear material 203, and the propagation unit 207 composed of a propagation medium 205 that does not contribute to the wavelength conversion. The propagation unit 207 is a component for obtaining the distance L to obtain the Talbot phase lock. In addition, the nonlinear material 203 and propagation medium 205 are combined with claddings 204 to form an integrated planar waveguide structure.

Incidentally, a medium with a refractive index greater than that of the claddings 204 is selected as the propagation medium 205, in order to set up a waveguide between the propagation medium 205 and the claddings 204 on its top and bottom. Thus, in the propagation unit 207, the laser light propagates in the guided mode nearly equal to that in the wavelength converting unit 206.

Forming the propagation unit 207 with the planar waveguide structure in this way makes it possible to remove the space propagation region from the configuration of the embodiment 3 shown in FIG. 4. Accordingly, the laser light inside the cavity is confined in the height direction. As a result, it can reduce the loss accompanying the spatial propagation as compared with the configuration of the embodiment 3, can oscillate the laser light at high efficiency, and can output the wavelength converted light rays at high efficiency.

In addition, removing the space propagation region enables reducing the beam spread in the height direction and the dissipation of the laser light inside the cavity, which occurs in the configuration of the embodiment 3. Accordingly, it can remove from the configuration of the embodiment 3 the lens 6 inserted for collimating in the height direction. As a result, a highly reliable array type wavelength converting laser device which can reduce the adjustment of the optical components can be set up.

In addition, in the configuration of FIG. 8, as for the optical film on the end face 202 of the wavelength converting element 2, it can be changed from the optical film that transmits the fundamental waves to an optical film that reflects the fundamental waves, and the output mirror 3 can be removed. In this case, since the removal of the output mirror 3 can reduce the number of the components, it can reduce the cost of manufacture. In addition, the reduction in the number of the optical components can reduce the adjustment, thereby being able to set up a highly reliable array type wavelength converting laser device.

As described above, according to the present embodiment 5, since the wavelength converting element 2 comprises the propagation unit 207, it can remove the space propagation region inside the cavity, thereby being able to output the wavelength converted light rays with a small diffraction loss due to the space propagation at high efficiency in addition to the advantages of the embodiment 3.

Embodiment 6

In the embodiments 1-5, examples have been described which form the cavity capable of wavelength conversion in such a manner as to satisfy the Talbot condition, and are able to improve the light focusing power in the array direction of the wavelength converted light rays (mth harmonic) resulting from the wavelength conversion. Here, as for the peak occurring in the far field (see FIG. 2E), which is obtained as the laser output in the configuration, its beam width is determined by the number of the light emitting points, and the number of the light emitting points has to be increased, so as to obtain the output of a thinner beam width and better beam quality.

Thus, the embodiment 6 describes a method for solving the problem, and an implementation method of an array type wavelength converting laser device with high beam quality. As a concrete method, it gives an optical polishing to the side surfaces of the element adjacent to the output mirror 3 to create a state in which a pseudo-infinite number of arrays exist in the array direction (x axis direction), thereby implementing the wavelength converted light ray output with high beam quality.

Figure 9A:
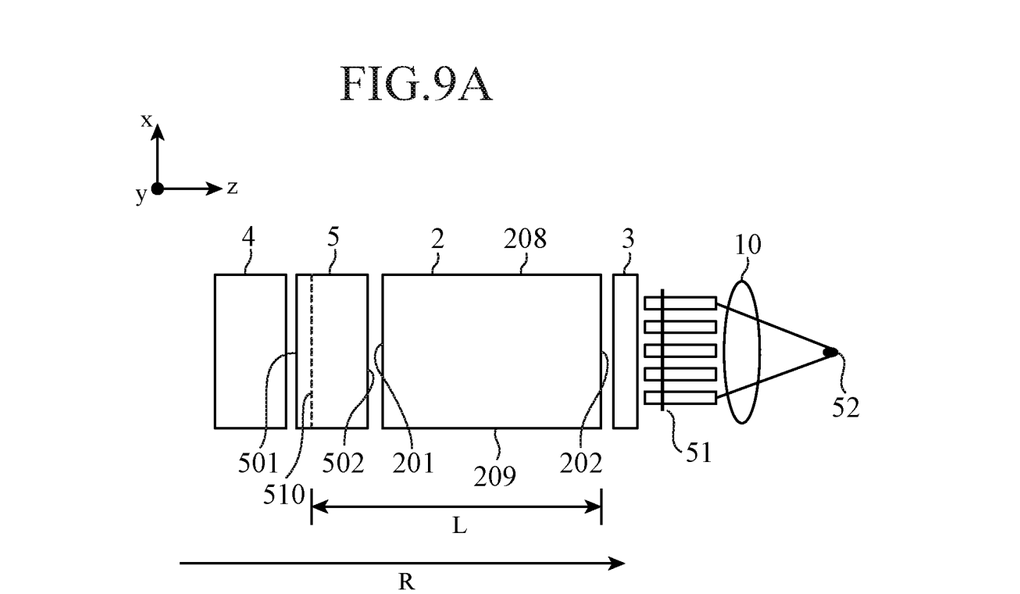
FIG. 9A and FIG. 9B are a top view and a side view schematically showing a configuration of an array type wavelength converting laser device of an embodiment 6 in accordance with the present invention.
Figure 9B:
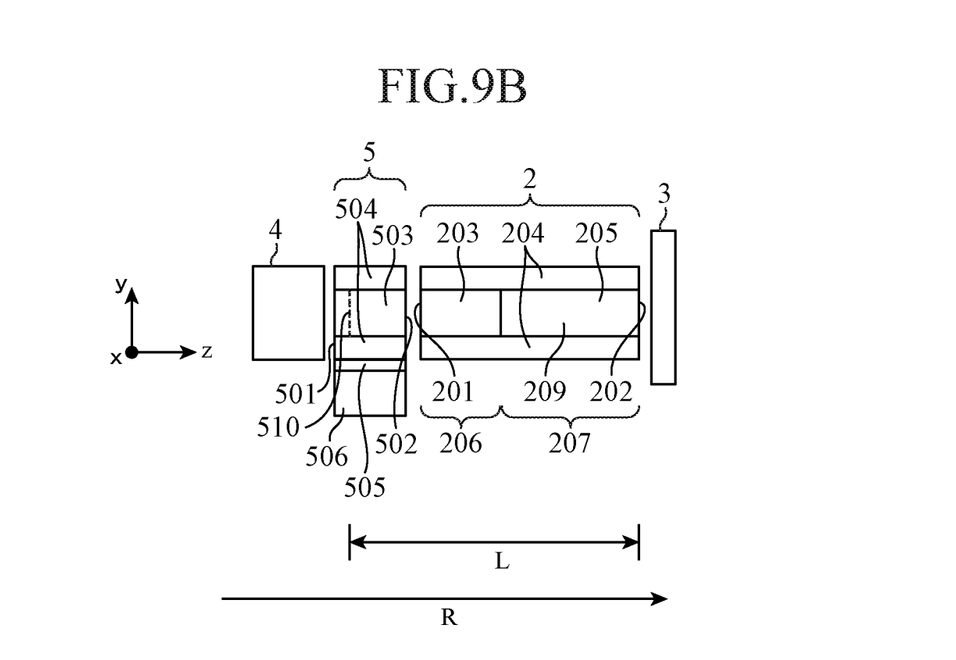

FIG. 9 is a top view and a side view schematically showing a configuration of an array type wavelength converting laser device of the embodiment 6 in accordance with the present invention. The array type wavelength converting laser device of the embodiment 6 shown in FIG. 9 is one that changes the side surfaces 208 and 209 of the wavelength converting element 2 in the embodiment 5 shown in FIG. 8 from an Azukatto surface to an optically polished surface. Since the other components are the same, they are designated by the same reference numerals and only the different portion will be described.

As for the wavelength converting element 2 in the embodiment 6, optical polishing is applied to its side surfaces 208 and 209. Thus, the fundamental waves and the mth harmonics propagating inside the cavity are reflected by the side surfaces 208 and 209.

Incidentally, it is not always necessary for the side surfaces 208 and 209 to be optically polished, but an optical film characterized by reflecting the fundamental waves and the mth harmonics can be formed. The optical film is formed by stacking dielectric thin films, for example.

The side surfaces 208 and 209 which have the characteristic of reflecting the fundamental waves and the mth harmonics create the state in which the pseudo-infinite number of arrays exist in the array direction (x axis direction) via the side surfaces 208 and 209 near the output mirror 3. The infinite number of arrays exists in the x axis direction, and the arrays undergo the Talbot phase synchronization, and at the peak of the beam in the far field shown in FIG. 2E, the width of a beam is narrow, and the beam is of high quality, compared with the beams of the embodiments 1-5 in which determination is made on the basis of the number of the light emitting points.

Incidentally, the foregoing description is made on the assumption that the side surfaces 208 and 209 of the wavelength converting element 2 are optically polished in their entirety. However, it may be configured that only parts of the side surfaces 208 and 209 on the side of the output mirror 3 are optically polished.

Here, when the side surfaces 208 and 209 are optically polished, there is a case where laser oscillation (parasitic oscillation) occurs through a path different from the path with regard to the original laser oscillation of the array type wavelength converting laser device owing to part of the laser light incident on the side surfaces 208 and 209. Accordingly, when the side surfaces 208 and 209 of the wavelength converting element 2 are optically polished, it is desirable that the length in the optical axis (z axis) direction, in which optical polishing is applied, be determined in such a manner as to prevent the parasitic oscillation which brings about the reduction in the efficiency of the original laser oscillation.

The foregoing shows the configuration of the embodiment 5, that is, the configuration in which the side surfaces 208 and 209 are optically polished with respect to the wavelength converting element 2 including the propagation unit 207. However, this is not essential. For example, optically polishing the side surfaces of an element disposed on the side of the output mirror 3 can offer a similar effect. For example, as to the configuration of the embodiment 4, optically polishing the side surfaces 208 and 209 of the wavelength converting element 2 can also achieve a similar effect. Furthermore, the embodiment 6 specifies the operation of the laser light in the horizontal direction (x axis direction), and as to the setup in vertical direction (y axis direction), it is not limited to the configuration shown in FIG. 8. Accordingly, it is not limited to the waveguide type cavity setup.

As described above, according to the present embodiment 6, it can create the state in which the pseudo-infinite number of arrays exist in the array direction (x axis direction) by optically polishing the side surfaces 208 and 209 of the wavelength converting element 2 adjacent to the output mirror 3, thereby being able to implement the wavelength converted light ray output with high beam quality.

Incidentally, it is to be understood that a free combination of the individual embodiments, variations of any components of the individual embodiments or removal of any components of the individual embodiments is possible within the scope of the present invention.

INDUSTRIAL APPLICABILITY

An array type wavelength converting laser device in accordance with the present invention can increase the light focusing power of the laser light as compared with a conventional setup. Accordingly, it is suitable for an application to an array type wavelength converting laser device and the like for obtaining wavelength converted light.

REFERENCE SIGNS LIST 1 laser element; 2 wavelength converting element; 3 output mirror; 4 semiconductor laser; 5 solid-state laser element; 6 lens; 10 lens; 101, 102 end face; 103 waist; 201, 202 end face; 203 nonlinear material; 204 cladding; 205 propagation medium; 206 wavelength converting unit; 207 propagation unit; 208, 209 side surface; 501, 502 end face; 503 laser medium; 504 cladding; 505 glue; 506 heat sink; 507 propagation medium; 508 gain generating unit; 509 propagation unit; 510 waist.

The invention claimed is:

1. An array type wavelength converting laser device comprising:
   at least one laser element with light emitting points, the laser element to output fundamental waves in a one-dimensional array;
   a wavelength converting element to carry out wavelength conversion of the incident fundamental waves, and to output wavelength converted light rays; and
   an output mirror to reflect the fundamental waves, and to transmit the wavelength converted light rays resulting from the wavelength conversion by the wavelength converting element, wherein
   the wavelength converting element is disposed between the laser element and the output mirror; and
   a distance between a position of a waist of the fundamental waves output from the laser element and the output mirror is set in accordance with a Talbot condition under which phase synchronization is achieved between the adjacent light emitting points with each other.

2. The array type wavelength converting laser device according to claim 1, wherein the distance is a quarter of a Talbot length.

3. The array type wavelength converting laser device according to claim 1, wherein the wavelength converting element outputs harmonics having an even multiple of a frequency of the fundamental waves as the wavelength converted light rays.

4. The array type wavelength converting laser device according to claim 1, wherein the laser element and the wavelength converting element have a planar waveguide structure in a direction perpendicular to an optical axis direction of a cavity of the fundamental waves and to an array direction.

5. The array type wavelength converting laser device according to claim 4, further comprising a lens to collimate laser light, the lens being disposed between the wavelength converting element and the output mirror, and disposed perpendicularly to the optical axis direction of the cavity and to the array direction.

6. The array type wavelength converting laser device according to claim 4, wherein the laser element comprises a propagator that has a planar waveguide structure and obtains the distance.

7. The array type wavelength converting laser device according to claim 4, wherein the wavelength converting element comprises a propagator that has a planar waveguide structure and obtains the distance.

8. The array type wavelength converting laser device according to claim 5, further comprising:
   a heat sink which is formed like a comb in the array direction, with tips of comb teeth being joined to the laser element, wherein
   the laser element comprises a laser medium that generates temperature distribution due to waste heat to the heat sink and generates refractive index distribution due to the temperature distribution.

9. The array type wavelength converting laser device according to claim 6, wherein side surfaces of the wavelength converting element are optically polished.

10. The array type wavelength converting laser device according to claim 7, wherein side surfaces of the wavelength converting element are optically polished.

11. The array type wavelength converting laser device according to claim 6, further comprising:
    optical films which are formed on side surfaces of the wavelength converting element, and have a characteristic of reflecting the fundamental waves and the wavelength converted light rays.

12. The array type wavelength converting laser device according to claim 7, further comprising:
    optical films which are formed on side surfaces of the wavelength converting element, and have a characteristic of reflecting the fundamental waves and the wavelength converted light rays.

* * * * *